(12) United States Patent
Long

(10) Patent No.: US 11,264,509 B2
(45) Date of Patent: Mar. 1, 2022

(54) THIN FILM TRANSISTOR, ARRAY SUBSTRATE, DISPLAY PANEL AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/642,820

(22) PCT Filed: May 31, 2019

(86) PCT No.: PCT/CN2019/089485
§ 371 (c)(1),
(2) Date: Feb. 27, 2020

(87) PCT Pub. No.: WO2020/024693
PCT Pub. Date: Feb. 6, 2020

(65) Prior Publication Data
US 2021/0159343 A1 May 27, 2021

(30) Foreign Application Priority Data
Aug. 3, 2018 (CN) .......................... 201821252825.2

(51) Int. Cl.
*H01L 29/786* (2006.01)
*H01L 27/12* (2006.01)
(52) U.S. Cl.
CPC ...... *H01L 29/78618* (2013.01); *H01L 27/124* (2013.01); *H01L 27/1237* (2013.01);
(Continued)

(58) Field of Classification Search
CPC ......... H01L 29/78618; H01L 29/78663; H01L 29/78645; H01L 29/7869; H01L 27/1237; H01L 27/124
See application file for complete search history.

(56) References Cited

U.S. PATENT DOCUMENTS

2015/0214286 A1\* 7/2015 Niu ..................... H01L 27/1244
257/72
2016/0260747 A1 9/2016 Cai et al.
(Continued)

FOREIGN PATENT DOCUMENTS

| | | |
|---|---|---|
| CN | 104218095 A | 12/2014 |
| CN | 205621414 U | 10/2016 |

(Continued)

OTHER PUBLICATIONS

International Search Report received for PCT Patent Application No. PCT/CN2019/089485, dated Sep. 2, 2019, 5 pages (2 pages of English Translation and 3 pages of Original Document).

*Primary Examiner* — Edward Chin
(74) *Attorney, Agent, or Firm* — Womble Bond Dickinson (US) LLP

(57) ABSTRACT

A thin film transistor, an array substrate, a display panel and a display device are provided, which is related to the field of display technologies. A thin film transistor comprises: a substrate; at least two active layers on the substrate, each active layer comprising a first terminal and a second terminal opposite to each other; a source and a drain above the substrate. The first terminal of each of the at least two active layers is electrically connected to the source, and the second terminal of each of the at least two active layers is electrically connected to the drain, and the at least two active layers are arranged on an upper surface of the substrate and separated from one another.

20 Claims, 2 Drawing Sheets

(52) U.S. Cl.
CPC .... *H01L 29/7869* (2013.01); *H01L 29/78645* (2013.01); *H01L 29/78663* (2013.01)

(56) References Cited

U.S. PATENT DOCUMENTS

| | | | |
|---|---|---|---|
| 2016/0358542 A1* | 12/2016 | Koyama | ................ C09K 11/06 |
| 2018/0190645 A1 | 7/2018 | Long et al. | |
| 2019/0131318 A1 | 5/2019 | Xue et al. | |
| 2020/0064668 A1* | 2/2020 | Liang | ................ H01L 27/1259 |

FOREIGN PATENT DOCUMENTS

| | | |
|---|---|---|
| CN | 107742648 A | 2/2018 |
| CN | 208521935 U | 2/2019 |
| KR | 2008-0072378 A | 8/2008 |

\* cited by examiner

THIN FILM TRANSISTOR, ARRAY SUBSTRATE, DISPLAY PANEL AND DISPLAY DEVICE

CROSS REFERENCE TO RELATED APPLICATIONS

The present application is a 35 U.S.C. 371 national stage application of a PCT International Application No. PCT/CN2019/089485, filed on May 31, 2019, which claims the benefits of priority of patent application 201821252825.2 filed on Aug. 3, 2018 to the Chinese Patent Office, the entire disclosure of which is incorporated herein by reference.

TECHNICAL FIELD

This disclosure relates to the field of display technologies, and in particular to a thin film transistor, an array substrate, a display panel and a display device.

BACKGROUND ART

Thin film transistor is a conventional electronic device in a display device, which for example can be arranged in an array substrate to drive pixels of the display device. However, the driving capability of a single thin film transistor still needs to be improved at present, and it is quite difficult to be applied in a high load region of the display device. Besides, large leakage currents still exist during operation of the display device comprising the thin film transistor (e.g., a liquid crystal display device).

SUMMARY

An embodiment of this disclosure provides a thin film transistor, comprising: a substrate; at least two active layers on the substrate, each active layer comprising a first terminal and a second terminal opposite each other; a source and a drain on the substrate. The first terminal of each of the at least two active layers is electrically connected to the source, and the second terminal of each of the at least two active layers is electrically connected to the drain, and the at least two active layers are arranged on an upper surface of the substrate and separated from one another.

According to some embodiments of this disclosure, the thin film transistor further comprises at least two gates corresponding to the at least two active layers, and an orthogonal projection of each active layer on the substrate is within an orthogonal projection of a corresponding gate on the substrate.

Alternatively, according to some embodiments of this disclosure, the thin film transistor further comprises at least two gates corresponding to the at least two active layers, the at least two gates being electrically connected with each other to form an integrated gate layer, and orthogonal projections of the at least two active layers on the substrate are within an orthogonal projection of the gate layer on the substrate.

According to some embodiments of this disclosure, the thin film transistor further comprises a source signal line and a drain signal line, the source signal line being electrically connected with the source and the drain signal line being electrically connected with the drain.

According to some embodiments of this disclosure, the source signal line and the drain signal line extend in a direction perpendicular to an extending direction of the source or the drain.

Alternatively, according to some embodiments of this disclosure, the source signal line and the drain signal line extend in a direction parallel with the extending direction of the source or the drain.

According to some embodiments of this disclosure, the thin film transistor further comprises a gate signal line, the gate signal line being electrically connected with the at least two gates, and an extending direction of the gate signal line is perpendicular to the extending direction of the source signal line.

According to some embodiments of this disclosure, the thin film transistor further comprises a gate insulating layer, an etch barrier layer and a passivation layer above the substrate. The gate insulating layer covers the at least two gates, each active layer being on a side of the gate insulating layer facing away the substrate, and the etch barrier layer covers the at least two active layers and the gate insulating layer, the source and the drain being on a side of the etch barrier layer facing away the gate insulating layer, and the passivation layer covers the source, the drain and the etch barrier layer.

According to some embodiments of this disclosure, the etch barrier layer comprises a via hole, the source and the drain being electrically connected with the at least two active layers by means of the via hole in the etch barrier layer.

According to some embodiments of this disclosure, a distance between the first terminal and the second terminal across the upper surface of each active layer is L, and a width of the upper surface of each active layer perpendicular to the distance is W, a ratio of W to L being greater than 1.

According to some embodiments of this disclosure, a material of the active layer comprises at least one selected from a group consisting of amorphous silicon, polysilicon, and oxide semiconductor.

Another embodiment of this disclosure provides an array substrate, comprising the thin film transistor according to any of the above embodiments.

Yet another embodiment of this disclosure provides a display panel, comprising the array substrate according to the above embodiment.

Still another embodiment of this disclosure provides a display device, comprising the display panel according to the above embodiment.

BRIEF DESCRIPTION OF DRAWINGS

In order to render the technical solutions of the embodiments of this disclosure more clearly, the drawings to be used in the description of the embodiments of this disclosure will be introduced briefly. Apparently, the drawings described below are only some embodiments of this disclosure, and one having ordinary skills in the art, other drawings can also be obtained from these drawings without inventive efforts.

DETAILED DESCRIPTION OF EMBODIMENTS

The technical solutions in the embodiments of this disclosure will be described clearly and completely with reference to the accompanying drawings. The described embodiments are part of possible embodiments of this disclosure, rather than all of them. Based on the embodiments in this disclosure, other embodiments obtained by one having ordinary skills in the art without inventive efforts all fall within the protection scope of the present application.

In some high load regions of a display device, such as a cell test region, a Gate on Array (GOA) region, a Demux region, in order to drive high loads, a thin film transistor (TFT) having a channel with a greater width-to-length ratio is usually used.

Figure 1:
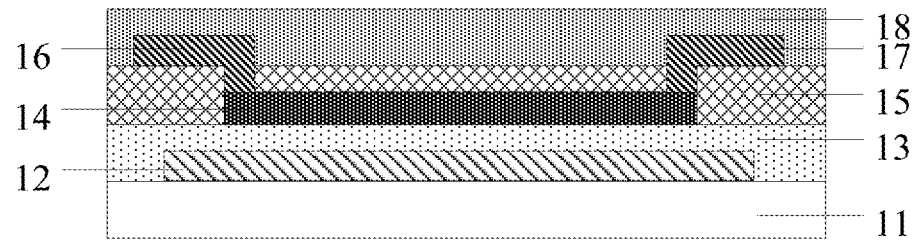
FIG. 1 shows a sectional view of a thin film transistor according to an embodiment of this disclosure.

FIG. 1 schematically shows a sectional view of a thin film transistor according to an embodiment of this disclosure. As shown in FIG. 1, the procedure of fabricating the thin film transistor of FIG. 1 may comprise: forming a gate 12 and a gate insulating layer 13 sequentially on a substrate 11, forming a continuous active layer 14 and an etch barrier layer 15 sequentially on the gate insulating layer 13, and then forming a source 16 and a drain 17 on the etch barrier layer 15, and finally forming a passivation layer 18. The source and the drain may be electrically connected with the continuous active layer 14 by means of a via hole in the etch barrier layer 15. By forming the source 16 and the drain 17 on the continuous active layer 14, the width of channel between the source 16 and the drain 17 is increased, and thus the width-to-length ratio of the channel of the fabricated thin film transistor is increased.

For the thin film transistor provided in the above embodiment of this disclosure, the inventors of the present application realize the following problems: due to a large area of the active layer which is apt to be affected by process defects and impurities, the yield of the active layer is reduced; besides, when the thin film transistor is applied to a liquid crystal display device, light emitted from a backlight source will easily impinge on the active layer after being refracted, scattered, diffusely reflected and so on, such that the material performance of the active layer will be degraded and thus the leakage currents of the thin film transistor will be increased.

Another embodiment of this disclosure provides a thin film transistor with a structure different from that of the thin film transistor as shown in FIG. 1. According to this embodiment, the thin film transistor comprises: a substrate; at least two active layers on the substrate, each active layer comprising a first terminal and a second terminal opposite to each other; a source and a drain on the substrate. The first terminal of each of the at least two active layers is electrically connected to the source, and the second terminal of each of the at least two active layers is electrically connected to the drain, and the at least two active layers are arranged on an upper surface of the substrate and separated from one another.

Figure 2:
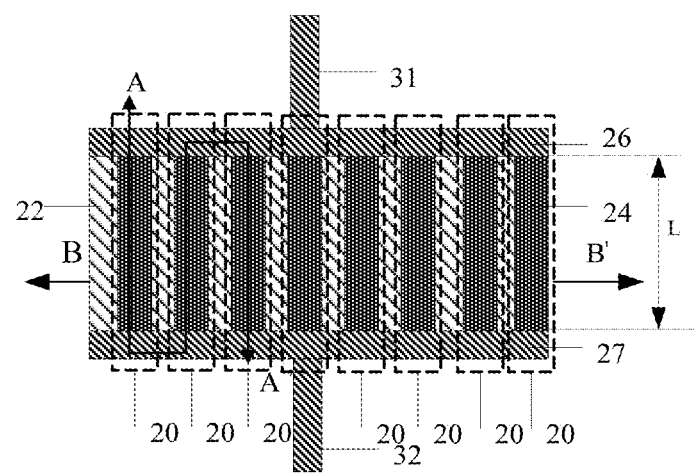
FIG. 2 shows a top perspective view of a thin film transistor according to another embodiment of this disclosure.
Figure 3:
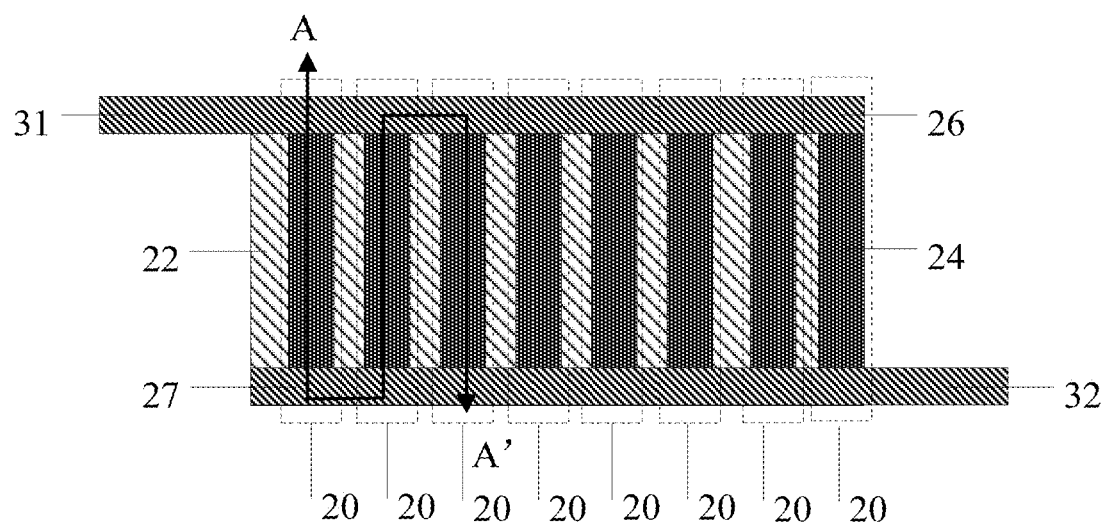
FIG. 3 shows a top perspective view of a thin film transistor according to yet another embodiment of this disclosure.
Figure 4:
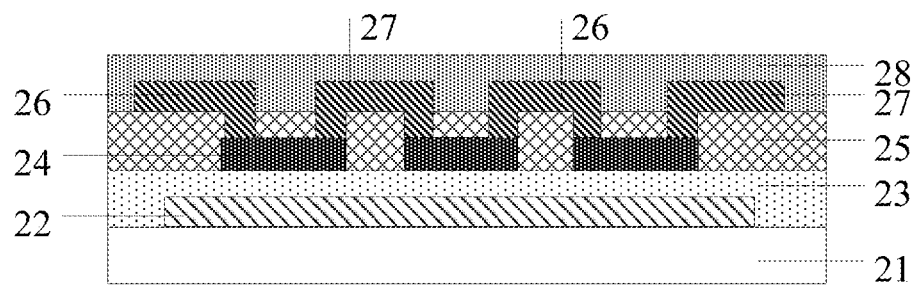
FIG. 4 schematically shows a sectional view of the thin film transistor of FIG. 2 or FIG. 3 taken along line AA'.

FIG. 2 and FIG. 3 show different examples of the thin film transistor according to the above embodiments of this disclosure respectively. FIG. 4 shows a sectional view of the examples of the thin film transistor of FIG. 2 or FIG. 3 taken along line AA' in FIG. 2 or FIG. 3. As shown in FIG. 2 to FIG. 4, according to some embodiments of the disclosure, the thin film transistor comprises a plurality of sub-TFT structures 20, and the sub-TFT structures 20 can be considered as being connected with each other in parallel. Each sub-TFT structure 20 comprises a gate 22, an active layer 24, a source 26 and a drain 27, and the active layers 24 of two adjacent sub-TFT structures 20 are separated from each other.

For the thin film transistors shown in FIG. 2 to FIG. 4, a plurality of sub-TFT structures connected in parallel are formed on the substrate 21, so that the width-to-length ratio of the entire channel of the thin film transistor can be improved, which makes the thin film transistor suitable to drive high loads. Besides, the active layers of the sub-TFT structures 20 are separated from each other, i.e., there is no active layer material between two adjacent sub-TFT structures 20, so there will not be a continuous large-area active layer region. In this way, the possible effects of process defects and impurities on the active layer can be reduced and thus the yield of the active layer 24 can be improved. Meanwhile, since the active layer of the thin film transistor is not a continuous layer structure, the problem of performance deterioration of the thin film transistor resulted from irradiation of the external light (e.g., back light) can be alleviated, and the leakage current of the thin film transistor can be reduced to some extent.

FIG. 2 and FIG. 3 only show an exemplary thin film transistor, which comprises 8 sub-TFT structures 20 connected in parallel. It can be understood that the number of the sub-TFT structures 20 connected in parallel comprised in the thin film transistor in the embodiments of the disclosure is greater than or equal to 2. In actual application, the number of the sub-TFT structures 20 connected in parallel may be determined upon actual needs.

Figure 5:
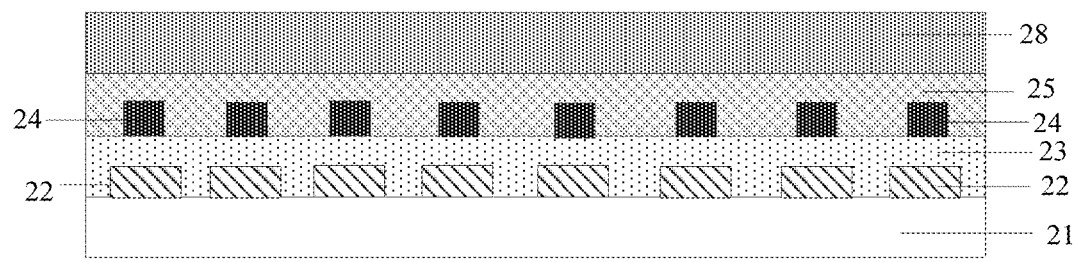
FIG. 5 schematically shows a sectional view of the thin film transistor of FIG. 2 taken along line BB'.

According to some embodiments of this disclosure, the thin film transistor further comprises at least two gates corresponding to the at least two active layers, and an orthogonal projection of each active layer on the substrate falls within an orthogonal projection of a corresponding gate on the substrate. In these embodiments, the at least two gates are independent from one another. That is, the gates of the sub-TFT structures are not electrically connected, and a same gate signal can be provided to the gate 22 of each sub-TFT structure 20 at the same time when it is required to drive high loads by the thin film transistor. FIG. 5 illustrates a sectional view of the thin film transistor of FIG. 2 taken along line BB'. The gates 22 of the sub-TFT structures are independent from one another. Alternatively, in another embodiment, the at least two gates are electrically connected with each other to form an integrated gate layer, and orthogonal projections of the at least two active layers on the substrate fall within an orthogonal projection of the gate layer on the substrate, and FIG. 4 shows an example of such a thin film transistor. For this example, during the fabrication procedure of the thin film transistor, after a gate metal film is formed, it does not need to be patterned, which can simplify the complexity of the fabrication process. As shown in FIG. 2 and FIG. 3, the thin film transistor further comprises a source signal line 31 and a drain signal line 32, the source signal line 31 being electrically connected with the source 26 of the thin film transistor and the drain signal line 32 being electrically connected with the drain 27 of the thin film transistor.

The source signal line 31 may transmit a source signal to the source 26, and the drain signal line 32 is electrically connected with a high load, and when the thin film transistor is switched on, the source signal inputted by the source signal line 31 of the thin film transistor is provided to the high load via the drain and the drain signal line 32.

According to some embodiments of this disclosure, when the source 26 and the drain 27 are being formed, the source signal line 31 and the drain signal line 32 can be formed simultaneously, and the source signal line 31, the drain signal line 32, the source 26 and the drain 27 can be made of the same material.

As shown in FIG. 2, the source signal line 31 and the drain signal line 32 extend in a direction perpendicular to an extending direction of the source or the drain of the thin film transistor. In the example of FIG. 2, the source 26 and the drain 27 of the thin film transistor are arranged in parallel, and the source signal line 31 and the drain signal line 32 extend in a direction perpendicular to the direction of the source or the drain. In other words, if the source 26 and the drain 27 extend in the horizontal direction, the source signal line 31 and the drain signal line 32 extend in the vertical direction.

As shown in FIG. 3, according to a further embodiment of this disclosure, the source signal line 31 and the drain signal line 32 extend in a direction parallel with the extending direction of the source or the drain. In the example of FIG. 3, the source 26 and the drain 27 are arranged in parallel, and the source signal line 31 and the drain signal line 32 extend in a direction parallel with the source or the drain. If the source 26 and the drain 27 extend in the horizontal direction, the source signal line 31 and the drain signal line 32 also extend in the horizontal direction.

According to an embodiment of this disclosure, the thin film transistor further comprises a gate signal line (not shown in FIG. 2 to FIG. 4), and the gate signal line is electrically connected with the at least two gates of the thin film transistor. In an example, the extending direction of the gate signal line is perpendicular to the extending direction of the source signal line 31.

According to an embodiment of this disclosure, a distance across the first terminal and the second terminal on the upper surface of each active layer of the thin film transistor is L, and a width of the upper surface of each active layer perpendicular to the distance is W, a ratio of W to L being greater than 1, as shown in FIG. 2. FIG. 2 schematically shows the distance L. W is namely the size of the width of the upper surface of each active layer perpendicular to the shown distance L. Therefore, for the plurality of sub-TFT structures 20 that can be considered as being connected with each other in parallel in the thin film transistor, the width-to-length ratio of the channel of each sub-TFT structure is greater than 1. In case the thin film transistor comprises N sub-TFT structures 20, the width-to-length ratio of the channel of the thin film transistor is greater than N, N being a positive integer greater than 1. Thereby, a thin film transistor having a channel with a greater width-to-length ratio can be obtained to drive high loads. Therefore, the thin film transistor provided in the embodiments of this disclosure can be applied in high load regions of a display device, such as a cell test region, a Gate on Array (GOA) region and a Demux region.

FIG. 4 is a partial sectional view of a thin film transistor taken along ling AA' in FIG. 2 or FIG. 3. As shown in FIG. 4, the thin film transistor 20 further comprises a gate insulating layer 23, an etch barrier layer 25 and a passivation layer 28 above the substrate 21; the gates are connected with each other to form an integrated gate layer 22, and the gate insulating layer 23 covers the gate layer 22, each active layer 24 is located on a side of the gate insulating layer 23 facing away the substrate 21, and the etch barrier layer 25 covers each active layer 24 and the gate insulating layer 23, the source and the drain are located on a side of the etch barrier layer 25 facing away the gate insulating layer, and the passivation layer 28 covers the source 26, the drain 27 and the etch barrier layer 25. In the example of FIG. 4, the etch barrier layer 25 comprises a via hole, the source and the drain are electrically connected with the at least two active layers by means of the via hole in the etch barrier layer.

According to an embodiment of the disclosure, the fabricating the thin film transistor of FIG. 4 may involve the following procedure: forming a gate metal film on a substrate 21; patterning the gate metal film to form a gate layer 22, e.g., etching the gate metal film by a photolithography process using a mask plate to form the gate layer 22; next, forming a gate insulating layer 23 by Plasma Enhanced Chemical Vapor Deposition (PECVD) or other deposition process; forming an active layer film on the gate insulating layer 23; patterning the active layer film to form a plurality of active layers 24 separated from each other with no active layer material between any two adjacent active layers 24; and then forming an etch barrier layer 25, the etch barrier layer 25 covering each active layer 24 and the gate insulating layer 23; and etching the etch barrier layer at a position corresponding to the active layer 24 to form a via hole, the via hole penetrating the etch barrier layer 25; and then forming a source-drain metal film on the etch barrier layer 25 and patterning the source-drain metal film to form a source 26 and a drain 27. When the source-drain metal film is being formed on the etch barrier layer 25, the material of the source-drain metal film will also be formed in the via hole of the etch barrier layer 25, so the source 26 and the drain 27 formed by the patterning process will be electrically connected with the active layer 24 by means of the via hole of the etch barrier layer 25. Finally, a passivation layer 28 is formed, the passivation layer 28 covering the source 26, the drain 27 and the etch barrier layer 25.

The gate metal film and the source-drain metal film can be fabricated by using same or similar processes, e.g., by magnetron sputtering and evaporation. The material of the gate 22, the source 26 and the drain 27 can be molybdenum, aluminum, aluminum-nickel alloy, chromium, copper or the like, and the material of the gate insulating layer 23 can be silicon nitride, silicon oxide, silicon oxynitride and so on.

According to an embodiment of this disclosure, the material of the active layer 24 comprises any of amorphous silicon, polysilicon, oxide conductor. In case the material of the active layer 24 is amorphous silicon, an amorphous silicon film is formed on the gate insulating layer 23 by PECVD or other deposition process, and a photoresist is coated on the amorphous silicon film and then exposed and developed by using a mask plate, and then the amorphous silicon film is etched to form a desired pattern. If the material of the active layer 24 is polysilicon, an amorphous silicon film can be formed on the gate insulating layer 23 by PECVD or other deposition process, and then the amorphous silicon film is crystallized by laser annealing or solid phase crystallization to form a polysilicon film, and after that a photoresist is coated on the polysilicon film and then exposed and developed by using a mask plate, and then the polysilicon film is etched to form a desired pattern. In case the material of the active layer 24 is an oxide semiconductor such as Indium GalliumZinc Oxide (IGZO), after an oxide semiconductor film is formed on the gate insulating layer 23, a photoresist is coated on the oxide semiconductor film and then exposed and developed by using a mask plate, and then the oxide semiconductor film is etched to form a desired pattern.

For the embodiments of this disclosure, by connecting at least two sub-TFT structures in parallel to form a thin film transistor and separating the active layers of two adjacent sub-TFT structures from each other, not only can the widthto-length ratio of the channel of the thin film transistor be improved, but also the area of the active region of the thin film transistor can be reduced, which improves the yield of the active region and reduces the leakage currents of the thin film transistor.

Another embodiment of this disclosure provides an array substrate, comprising the thin film transistor according to any of the above embodiments. In this embodiment, the substrates of the thin film transistors of the array substrate can be connected with each other to form a whole base substrate for the array substrate. The substrate 21 may be a glass substrate or a polymide (PI) substrate.

Yet another embodiment of this disclosure provides a display panel, comprising the above array substrate.

Still another embodiment of this disclosure provides a display device, comprising the above display panel.

Although some embodiments of this disclosure have been described, they can be further altered or modified once one skilled in the art learns the technical concept of this disclosure. Therefore, the appended claims are intended to be construed as comprising the embodiments described in the disclosure as well as all altered and modified embodiments falling within the scope of the claims of the present application.

Finally, it should be further noted that terms of "comprise", "include" or other variants are intended to mean a non-exclusive inclusion such that a process, a method, an object or a terminal device comprising a series of elements not only comprises those elements, but also comprises other elements not listed explicitly, or further comprises elements inherent in the process, the method, the object or the terminal device. Where there are no more limitations, elements defined by the wording of "comprising a . . . " does not exclude the presence of further same elements in the process, the method, the object or the terminal device comprising the elements.

What is stated above is only part of the possible embodiments of this disclosure, but the protection scope of the present application is not limited thereto. Any variation or substitution easily conceivable for one skilled person who is familiar with this art within the technical scope revealed in the disclosure should fall within the protection scope of the present application. Therefore, the protection scope of the present application should be subject to the protection scope of the claims.

The invention claimed is:

1. A thin film transistor, comprising:
   a substrate;
   N active layers on the substrate, each active layer comprising a first terminal and a second terminal opposite to each other, and
   a source and a drain on the substrate,
   wherein the first terminal of each active layer of the N active layers is electrically connected to the source, and the second terminal of each active layer of the N active layers is electrically connected to the drain, and
   wherein the N active layers are arranged on an upper surface of the substrate and separated from one another, and the N active layers are independent of each other and connected in parallel with each other between the source and the drain, and
   wherein the thin film transistor comprises a channel with a width-to-length ratio greater than N, N is a positive integer greater than 1.

2. The thin film transistor according to claim 1, wherein the thin film transistor further comprises N gates corresponding to the N active layers, and an orthogonal projection of each active layer on the substrate is within an orthogonal projection of a corresponding gate on the substrate.

3. The thin film transistor according to claim 1, wherein the thin film transistor further comprises N gates corresponding to the N active layers, the N gates is electrically connected with each other to form an integrated gate layer, and orthogonal projections of the N active layers on the substrate are within an orthogonal projection of the integrated gate layer on the substrate.

4. The thin film transistor according to claim 1, wherein the thin film transistor further comprises a source signal line and a drain signal line, the source signal line is electrically connected with the source and the drain signal line is electrically connected with the drain.

5. The thin film transistor according to claim 4, wherein the source signal line and the drain signal line extend in a direction perpendicular to an extending direction of the source or the drain.

6. The thin film transistor according to claim 4, wherein the source signal line and the drain signal line extend in a direction parallel with an extending direction of the source or the drain.

7. The thin film transistor according to claim 2, wherein the thin film transistor further comprises a gate signal line, the gate signal line is electrically connected with the N gates, and an extending direction of the gate signal line is perpendicular to an extending direction of the source signal line.

8. The thin film transistor according to claim 2, wherein the thin film transistor further comprises a gate insulating layer, an etch barrier layer and a passivation layer above the substrate, wherein the gate insulating layer covers the N gates, each active layer is located on a side of the gate insulating layer facing away the substrate, and the etch barrier layer covers the N active layers and the gate insulating layer, the source and the drain are located on a side of the etch barrier layer facing away the gate insulating layer, and the passivation layer covers the source, the drain and the etch barrier layer.

9. The thin film transistor according to claim 8, wherein the etch barrier layer comprises a via hole, the source and the drain are electrically connected with the N active layers by means of the via hole in the etch barrier layer.

10. The thin film transistor according to claim 1, wherein a distance between the first terminal and the second terminal across the upper surface of each active layer is L, and a width of the upper surface of each active layer perpendicular to the distance is W, a ratio of W to L is greater than 1.

11. The thin film transistor according to claim 1, wherein a material of the active layer comprises at least one selected from a group consisting of amorphous silicon, polysilicon and oxide semiconductor.

12. An array substrate, comprising the thin film transistor according to claim 1.

13. A display panel, comprising the array substrate according to claim 12.

14. A display device, comprising the display panel according to claim 13.

15. The array substrate according to claim 12, wherein the thin film transistor further comprises a gate signal line, the gate signal line is electrically connected with the N gates, and an extending direction of the gate signal line is perpendicular to an extending direction of the source signal line.

16. The array substrate according to claim 12, wherein the thin film transistor further comprises a gate insulating layer, an etch barrier layer and a passivation layer above the substrate, wherein the gate insulating layer covers the N gates, each active layer is located on a side of the gate insulating layer facing away the substrate, and the etch barrier layer covers the N active layers and the gate insulating layer, the source and the drain are located on a side of the etch barrier layer facing away the gate insulating layer, and the passivation layer covers the source, the drain and the etch barrier layer.

17. The array substrate according to claim 12, wherein the thin film transistor further comprises N gates corresponding to the N active layers, and an orthogonal projection of each active layer on the substrate is within an orthogonal projection of a corresponding gate on the substrate.

18. The array substrate according to claim 12, wherein the thin film transistor further comprises N gates corresponding to the N active layers, the N gates is electrically connected with each other to form an integrated gate layer, and orthogonal projections of the N active layers on the substrate are within an orthogonal projection of the integrated gate layer on the substrate.

19. The array substrate according to claim 12, wherein the thin film transistor further comprises a source signal line and a drain signal line, the source signal line is electrically connected with the source and the drain signal line is electrically connected with the drain.

20. The thin film transistor according to claim 10, wherein a gap between adjacent active layers of the N active layers is smaller than the distance W.

* * * * *